United States Patent
Lan et al.

(10) Patent No.: US 11,817,528 B2
(45) Date of Patent: Nov. 14, 2023

(54) NITRIDE-BASED LIGHT-EMITTING DIODE DEVICE

(71) Applicant: XIAMEN SAN'AN OPTOELECTRONICS CO., LTD., Xiamen (CN)

(72) Inventors: Yung-Ling Lan, Wuhu (CN); Chan-Chan Ling, Wuhu (CN); Chi-Ming Tsai, Wuhu (CN)

(73) Assignee: XIAMEN SAN'AN OPTOELECTRONICS CO., LTD., Fujian (CN)

(*) Notice: Subject to any disclaimer, the term of this patent is extended or adjusted under 35 U.S.C. 154(b) by 0 days.

(21) Appl. No.: 17/981,088

(22) Filed: Nov. 4, 2022

(65) Prior Publication Data

US 2023/0066785 A1 Mar. 2, 2023

Related U.S. Application Data

(63) Continuation of application No. 16/949,639, filed on Nov. 9, 2020, now Pat. No. 11,522,106, which is a
(Continued)

(30) Foreign Application Priority Data

May 17, 2018 (CN) .......................... 201810470874.1

(51) Int. Cl.
*H01L 33/32* (2010.01)
*H01L 33/04* (2010.01)

(52) U.S. Cl.
CPC ............ *H01L 33/325* (2013.01); *H01L 33/04* (2013.01)

(58) Field of Classification Search
CPC .............................. H01L 33/325; H01L 33/04
See application file for complete search history.

(56) References Cited

U.S. PATENT DOCUMENTS

| | | | |
|---|---|---|---|
| 2018/0211919 A1* | 7/2018 | Pan | ................... H01L 21/02458 |
| 2021/0005778 A1* | 1/2021 | Huang | ................... H01L 33/12 |

FOREIGN PATENT DOCUMENTS

| | | |
|---|---|---|
| CN | 103489898 A | 1/2014 |
| CN | 108447953 A | 8/2018 |
| TW | 201705518 A | 2/2017 |

OTHER PUBLICATIONS

Search Report issued to PCT Application No. PCT/CN2019/074127 by the RO/CNIPA dated May 6, 2019.
(Continued)

*Primary Examiner* — Mark W Tornow
(74) *Attorney, Agent, or Firm* — Muncy, Geissler, Olds & Lowe

(57) ABSTRACT

A nitride-based light-emitting diode (LED) device includes an n-type nitride semiconductor layer, an active layer disposed on the n-type nitride semiconductor layer, a p-type nitride semiconductor layer disposed on the active layer, and a defect control unit disposed between the n-type nitride semiconductor layer and the active layer. The defect control unit includes first, second and third defect control layers that are sequentially disposed on the n-type nitride semiconductor layer, and that have different doping concentrations. The third defect control layer includes one of Al-containing ternary nitride, Al-containing quaternary nitride, and a combination thereof.

20 Claims, 2 Drawing Sheets

Related U.S. Application Data continuation-in-part of application No. PCT/CN2019/074127, filed on Jan. 31, 2019.

(56) References Cited

OTHER PUBLICATIONS

Search Report appended to an Office Action issued to Chinese Counterpart Application No. 2018104708741 by the CNIPA dated Mar. 29, 2019, with an English translation thereof.

\* cited by examiner

NITRIDE-BASED LIGHT-EMITTING DIODE DEVICE

CROSS-REFERENCE TO RELATED APPLICATION

This application is a continuation application of U.S. patent application Ser. No. 16/949,639 (filed on Nov. 9, 2020), which is a bypass continuation-in-part application of International Application No. PCT/CN2019/074127 filed on Jan. 31, 2019, that claims priority of Chinese Invention Patent Application No. 201810470874.1 filed on May 17, 2018.

The entire content of each of these prior patent applications is incorporated herein by reference.

FIELD

The disclosure relates to a semiconductor optoelectronic device, and more particularly to a nitride-based light-emitting diode (LED) device.

BACKGROUND

A nitride-based light-emitting diode (LED) is among one of the semiconductor solid-state light emitting devices that can directly convert electricity into light using a semiconductor p-n junction as the light emitting material. A conventional LED generally includes a substrate, and an n-type nitride semiconductor layer, a stress release layer, an active layer, an electron blocking layer and a p-type nitride layer that are sequentially disposed on the substrate in such order. The stress release layer includes multiple pairs of an InGaN layer and a GaN layer that are alternately stacked on one another. The stress release layer is usually formed with several V-shaped defects (pits) at low temperature to release stress in LED device. The V-shaped defects are initially induced by a lattice mismatch and a large difference of thermal expansion coefficients between a sapphire substrate and a GaN epitaxial layer (i.e., n-type nitride semiconductor layer), and then the resultant dislocations propagate to form the V-shaped defects in the stress release layer. Since the size and density of the V-shaped defects are random and uncontrollable, distribution of electrons and holes within the LED device would be non-uniform, resulting in electric leakage and efficiency droop, thereby affecting the quantum yield of the LED device.

SUMMARY

Therefore, an object of the disclosure is to provide a nitride-based light-emitting diode (LED) device that can alleviate or eliminate at least one of the drawbacks of the prior art.

According to the disclosure, the nitride-based LED device includes an n-type nitride semiconductor layer, an active layer, a p-type nitride semiconductor layer, and a defect control unit.

The active layer is disposed on the n-type nitride semiconductor layer. The p-type nitride semiconductor layer is disposed on the active layer opposite to the n-type nitride semiconductor layer.

The defect control unit is disposed between the n-type nitride semiconductor layer and the active layer, and includes a first defect control layer disposed on the n-type nitride semiconductor layer, a second defect control layer disposed on the first defect control layer, and a third defect control layer disposed on the second defect control layer. Each of the first defect control layer, the second defect control layer and the third defect control layer is doped with an n-type impurity. The first defect control layer has an n-type doping concentration ranging from $1\times10^{17}/cm^3$ to $5\times10^{18}/cm^3$. The second defect control layer has an n-type doping concentration that is greater than that of the first defect control layer, and that is lower than that of the n-type nitride semiconductor layer. The third defect control layer includes one of Al-containing ternary nitride, Al-containing quaternary nitride, and a combination thereof.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
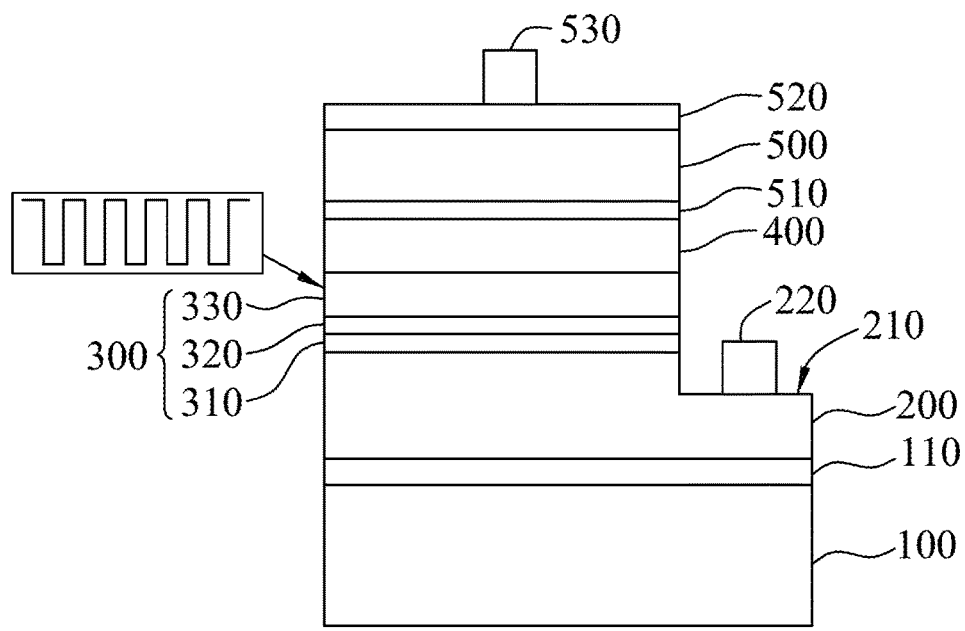
FIG. 1 is a schematic view illustrating a first embodiment of a nitride-based light-emitting diode (LED) device of this disclosure, and an energy band diagram of a third defect control layer of the first embodiment.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, a first embodiment of a nitride-based light-emitting diode (LED) device according to the present disclosure includes a substrate 100, an n-type nitride semiconductor layer 200, a defect control unit 300, an active layer 400, and a p-type nitride semiconductor layer 500.

The substrate 100 may be made of a material suitable for epitaxial growth, which may include, but is not limited to, sapphire, silicon (Si), silicon carbide (SiC), zinc oxide (ZnO), gallium nitride (GaN), and aluminum nitride (AlN).

The n-type nitride semiconductor layer 200 is formed on an upper surface of the substrate 100. In certain embodiments, the n-type nitride semiconductor layer 200 may be made of GaN doped with an n-type impurity, such as Si, Ge, Sn, and Pb. In other embodiments, the n-type nitride semiconductor layer 200 may be an unintentionally doped GaN layer.

The nitride-based LED device may further include a buffer layer 110 disposed between the substrate 100 and the n-type nitride semiconductor layer 200 for reducing a lattice mismatch therebetween. There are no particular limitations on the material for making the buffer layer 110, as long as the buffer layer 110 is capable of being lattice matched with the substrate 100. Examples of such material of the buffer layer 110 may include, but are not limited to, AlN, GaN, AlGaN, and combinations thereof. In certain embodiments, the buffer layer 110 is a composite structure that includes several layer pairs alternately stacked on one another, each of the layer pairs has two layers made of different materials as mentioned above.

The active layer 400, which is a region for radiative recombination of electrons and holes, is disposed on the n-type nitride semiconductor layer 200 opposite to the buffer layer 110. The active layer 400 includes multiples layer pairs, each layer pair including a potential barrier layer and a potential well layer. The potential barrier layers and the potential well layers in the active layer 400 are alternately stacked. The potential barrier layer may be made of GaN, AlGaN, or AlInGaN. The potential well layer may be made of InGaN.

The p-type nitride semiconductor layer 500 is disposed on the active layer 400. The p-type nitride semiconductor layer 500 may be doped with a p-type impurity, such as Mg, Ca, Sr, Ba, and combinations thereof. In this embodiment, the p-type nitride semiconductor layer 500 is doped with Mg, and serves to provide holes.

The nitride-based LED device may further include an electron blocking layer 510 disposed between the active layer 400 and the p-type nitride semiconductor layer 500 for preventing electron overflow.

The defect control unit 300 is disposed between the n-type nitride semiconductor layer 200 and the active layer 400. The defect control unit 300 includes a first defect control layer 310, a second defect control layer 320, and a third defect control layer 330 that are sequentially disposed on the n-type nitride semiconductor layer 200 in such order, and that have different doping concentrations.

The defect control unit 300 serves to control the size and density of V-shaped defects 340 which are formed due to the lattice mismatch between the substrate 100 and the n-type nitride semiconductor layer 200 (see FIG. 3), and to prevent loss of the antistatic property of the nitride-based LED device, so as to improve the injection efficiency of holes, thereby improving the quantum yield of the nitride-based LED device.

Specifically, the first defect control layer 310 may be made of a material selected from the group consisting of GaN, InGaN, AlGaN, InAlGaN, and combinations thereof. In this embodiment, the first defect control layer 310 is a low temperature-grown n-type GaN layer for controlling the depth of the V-shaped defects 340. By adjusting the thickness, the doping concentration and growth temperature of the first defect control layer 310, the depth of the V-shaped defects 340 can be well controlled, so as to increase the injection efficiency of holes. For example, the first defect control layer 310 may be doped with an n-type impurity, and the n-type doping concentration of the first defect control layer 310 is lower than that of the n-type nitride semiconductor layer 200. In certain embodiments, the n-type doping concentration of the first defect control layer 310 ranges from $1\times10^{17}/cm^3$ to $5\times10^{18}/cm^3$. The first defect control layer 310 may have a thickness ranging from 50 Å to 5000 Å.

The second defect control layer 320 is made of a material selected from the group consisting of GaN, InGaN, AlGaN, InAlGaN, and combinations thereof. In this embodiment, the second defect control layer 320 is an n-type GaN layer, i.e., doped with an n-type impurity. In certain embodiments, the n-type doping concentration of the second defect control layer 320 is greater than that of the first defect control layer 310, and is lower than that of the n-type nitride semiconductor layer 200. For example, the n-type doping concentration of the second defect control layer 320 ranges from $1\times10^{17}/cm^3$ to $1\times10^{19}/cm^3$. Thus, the second defect control layer 320 is capable of improving the reduced antistatic property of the nitride-based LED device caused by the V-shaped defects 340 (i.e., enhancing the antistatic capability thereof). The second defect control layer 320 may have a thickness ranging from 10 Å to 1000 Å.

The third defect control layer 330 includes Al-containing ternary nitride, Al-containing quaternary nitride, or a combination thereof. In certain embodiments, the third defect control layer 330 is one of an Al-containing nitride superlattice structure and an Al-containing nitride monolayer structure.

In this embodiment, the third defect control layer 330 is an Al-containing ternary nitride superlattice structure which includes multiple pairs of layers, each of which contains a first layer (e.g., Al-containing layer) and a second layer (e.g., Al-free layer) which has a band gap lower than that of the first layer. The first layers and the second layers in the Al-containing ternary nitride superlattice structure are alternately stacked. As shown in the energy band diagram of FIG. 1, each pair of the third defect control layer 330 has a periodical change of band gap. For example, each pair of the Al-containing ternary nitride superlattice structure contains the first layer represented by $Al_{a1}Ga_{1-a1}N$, and the second layer represented by $In_{e1}Ga_{1-e1}N$, and $0<a1\leq0.3$, and $0<e1\leq0.3$. Alternatively, each pair of the Al-containing ternary nitride superlattice structure may contain the first layer represented by $Al_{a2}In_{1-a2}N$, and the second layer represented by $In_{c1}Al_{1-c1}N$, and $0<a2\leq0.3$, and $0<c1\leq0.3$.

In certain embodiments, the third defect control layer 330 is doped with an n-type impurity, and the doping concentration of the third defect control layer 330 is lower than those of the first defect control layer 310, the second defect control layer 320, and the n-type nitride semiconductor layer 200. For example, the third defect control layer 330 may have a doping concentration ranging from $1\times10^{17}/cm^3$ to $1\times10^{18}/cm^3$, and may have a thickness ranging from 100 Å to 5000 Å.

Based on the above, the relationship of the n-type doping concentration among the first defect control layer 310, the second defect control layer 320, the third defect control layer 330 and the n-type nitride semiconductor layer 200 may be described as follows: the doping concentration of the nitride semiconductor layer 200 is greater than that of the second defect control layer 320, the doping concentration of the second defect control layer 320 is greater than that of the first defect control layer 310, and the doping concentration of the first defect control layer 310 is greater than that of the third defect control layer 330.

Figure 3:
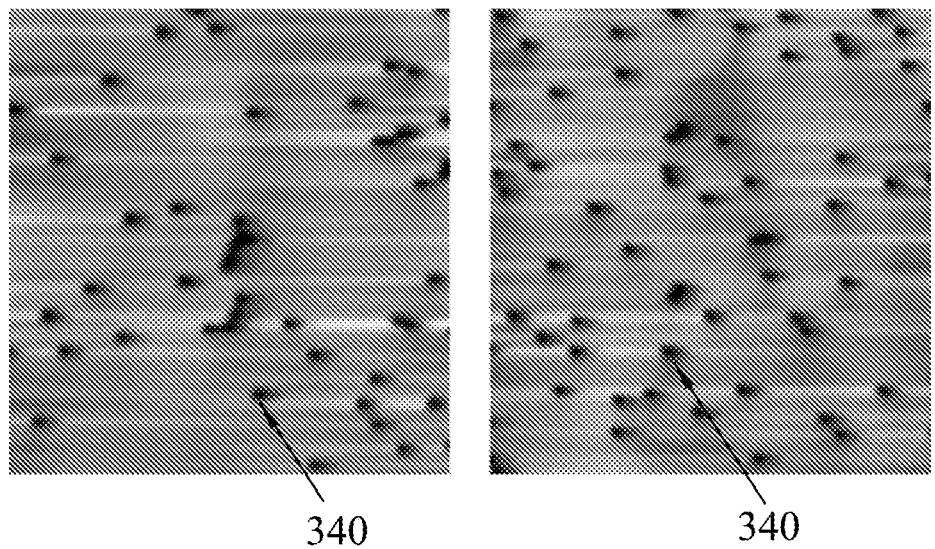
FIG. 3 are atomic force microscopic images illustrating the topography of a conventional LED device (left image) and that of the first embodiment of the nitride-based LED device, respectively (right image)

Since the third defect control layer 330 includes Al-containing ternary and/or quaternary nitride (e.g., the Al-containing ternary nitride superlattice structure in this embodiment, i.e., doping Al therein), the density and size of the V-shaped defects 340 may be increased (see right image of FIG. 3), as compared to that of the stress release layer (i.e., multiple pairs of an InGaN layer and a GaN layer) of the conventional LED device (see left image of FIG. 3). As such, the holes may be injected into the active layer 400 from a side wall of the V-shaped defects 340, so as to increase the injection efficiency of holes. By virtue of the Al-containing ternary nitride superlattice structure that includes the first and second layers respectively having high and low band gaps, the electron migration rate and electron overflow in the nitride-based LED device can be reduced, and recombination of the electrons and holes within the active layer 400 can be improved, so as to enhance the quantum yield of the nitride-based LED device and reduce efficiency droop.

In this embodiment, the nitride-based LED device is formed with a mesa structure 210 which is exposed from the n-type nitride semiconductor layer 200, and which may be formed by etching from the p-type nitride semiconductor layer 500 to the n-type nitride semiconductor layer 200. The nitride-based LED device further includes a first electrode 220 that is formed on the mesa structure 210, and a second electrode 530 that is formed on a mesa structure of the p-type nitride semiconductor layer 500. The first electrode 220 may be made of a material selected from the group consisting of Ti, Al, Au, and combinations thereof. The second electrode 530 may be made of chromium/gold (Cr/Au).

The nitride-based LED device may further include a p-type ohmic contact layer 520 disposed between the p-type nitride semiconductor layer 500 and the second electrode 530 for reducing an impedance therebetween. The p-type ohmic contact layer 520 may be made of a material selected from the group consisting of nickel/gold laminate, indium tin oxide (ITO), and zinc oxide (ZnO).

When an electric current flows through the active layer 400 via the first electrode 220 and the second electrode 530, the electrons which migrated from the n-type nitride semiconductor layer 200 and the holes which migrated from the p-type nitride semiconductor layer 500 can undergo recombination in the active layer 400, so as to allow the active layer 400 to emit light.

Figure 2:
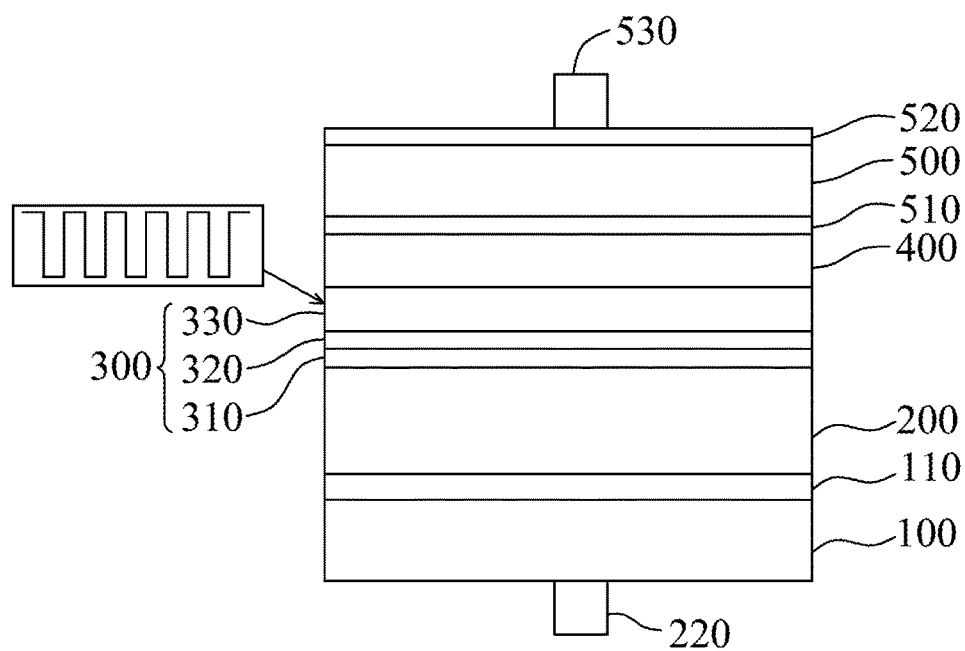
FIG. 2 is a schematic view illustrating a variation of the first embodiment of the nitride-based LED device and an energy band diagram of the third defect control layer thereof.

Referring to FIG. 2, in a variation of the first embodiment, when the substrate 100 is made of GaN or Si, the mesa structure 210 is not formed to expose the n-type nitride semiconductor layer 200, and the first electrode 220 is disposed on the substrate 100 opposite to the n-type nitride semiconductor layer 200.

A second embodiment of the nitride-based LED device is similar to the first embodiment, except that in the second embodiment, the third defect control layer 330 is an Al-containing quaternary nitride superlattice structure which includes multiple pairs of layers. The layers in each pair contain a first layer represented by $Al_{x1}In_{y1}Ga_{1-x1-y1}N$ and a second layer represented by $Al_{m1}In_{z1}Ga_{1-m1-z1}N$. The first layers and the second layers in the Al-containing quaternary nitride superlattice structure are alternately stacked, and $0<x1\le0.3$, $0<y1\le0.3$, $0<m1\le0.3$, and $0<z1\le0.3$, with the proviso that x1 is different from m1, or y1 is different from z1.

A third embodiment of the nitride-based LED device according to the present disclosure is similar to the first embodiment, except that in the third embodiment, the third defect control layer 330 is an Al-containing nitride superlattice structure which includes an Al-containing ternary nitride and an Al-containing quaternary nitride, and which includes multiple pairs of layers. The layers in each pair contain a first layer including Al-containing quaternary nitride, and a second layer including Al-containing ternary nitride. The first layers and the second layers in the Al-containing nitride superlattice structure are alternately stacked. For example, the first layer may be represented by $Al_{x2}In_{y2}Ga_{1-x2-y2}N$ and the second layer may be represented by $In_{m2}Ga_{1-m2}N$, and $0<x2\le0.3$, $0<y2\le0.3$, and $0<m2\le0.3$. In certain embodiments, the first layer is represented by $Al_{x3}In_{y3}Ga_{1-x3-y3}N$, and the second layer is represented by $In_{z3}Al_{1-z3}N$, and $0<x3\le0.3$, $0<y3\le0.3$, and $0<z3\le0.3$. In other embodiments, the first layer is represented by $Al_{x4}In_{y4}Ga_{1-x4-y4}N$ and the second layer is represented by $Al_{1-z4}GaN$, and $0<x4\le0.3$, $0<y4\le0.3$, and $0<z4\le0.3$.

Figure 4:
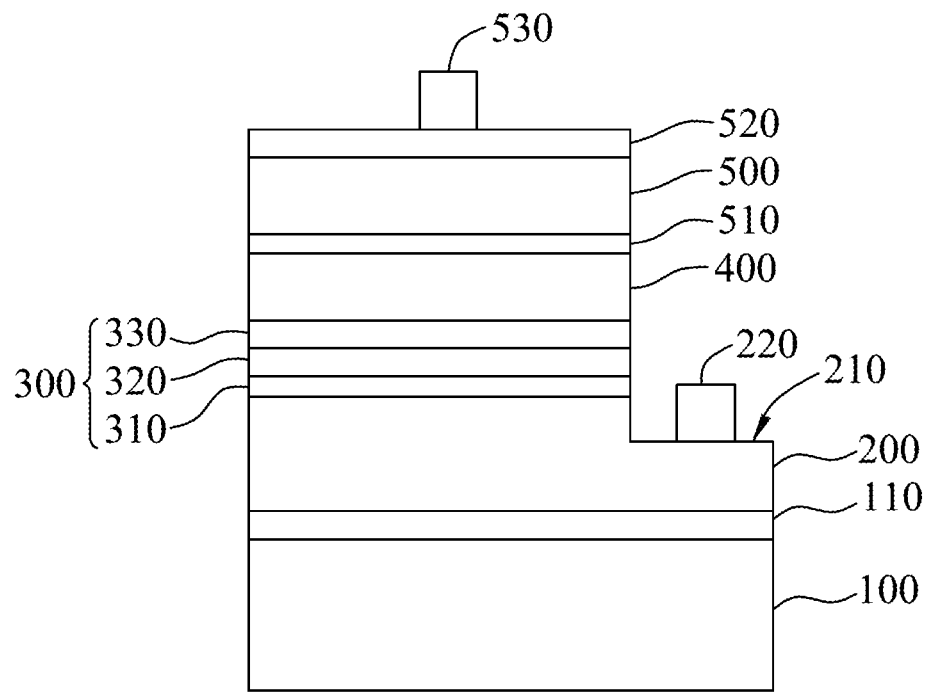
FIG. 4 is a schematic view illustrating a fourth embodiment of the nitride-based LED device according to the disclosure.

Referring to FIG. 4, a fourth embodiment of the nitride-based LED device according to the present disclosure is generally similar to the first embodiment, except that in the fourth embodiment, the third defect control layer 330 is an Al-containing ternary nitride monolayer structure, which includes one of AlGaN and InAlN. Alternatively, the third defect control layer 330 may be an Al-containing quaternary nitride monolayer structure, which includes AlInGaN.

In summary, by virtue of the defect control unit 300 disposed between the n-type nitride semiconductor layer 200 and the active layer 400, the density and size of the V-shaped defects 340 formed inside the nitride-based LED device can be controlled. That is, the depth of the V-shaped defects 340 can be controlled by the first defect control layer 310, the reduced antistatic capability of the nitride-based LED device caused by the V-shaped defects 340 can be improved by the second defect control layer 320, and the density of the V-shaped defects 340 can be controlled by the third defect control layer 330. As such, the injection efficiency of the holes can be increased, while the electron migration rate, the electric overflow, and the efficiency droop effect can be effectively reduced, so as to improve the distribution uniformity of electrons and holes in the active layer 400, thereby enhancing the quantum yield of the nitride-based LED device of this disclosure.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A nitride-based light-emitting diode (LED) device, comprising:
    an n-type nitride semiconductor layer;
    an active layer disposed on said n-type nitride semiconductor layer;
    a p-type nitride semiconductor layer disposed on said active layer opposite to said n-type nitride semiconductor layer; and
    a defect control unit disposed between said n-type nitride semiconductor layer and said active layer, and including a first defect control layer disposed on said n-type nitride semiconductor layer, a second defect control layer disposed on said first defect control layer, and a third defect control layer disposed on said second defect control layer, each of said first defect control layer, said second defect control layer and said third defect control layer being doped with an n-type impurity, wherein said first defect control layer has an n-type doping concentration ranging from $1\times10^{17}/cm^3$ to $5\times10^{18}/cm^3$, wherein said second defect control layer has an n-type doping concentration that is greater than that of said first defect control layer, and that is lower than that of said n-type nitride semiconductor layer, and wherein said third defect control layer includes one of Al-containing ternary nitride, Al-containing quaternary nitride, or a combination thereof.

2. The nitride-based LED device as claimed in claim 1, wherein said second defect control layer has an n-type doping concentration ranging from $1\times10^{17}/cm^3$ to $1\times10^{19}/cm^3$.

3. The nitride-based LED device as claimed in claim 1, wherein said third defect control layer is one of an Al-containing nitride superlattice structure and an Al-containing nitride monolayer structure.

4. The nitride-based LED device as claimed in claim 3, wherein said third defect control layer is an Al-containing ternary nitride superlattice structure which includes multiple pairs of layers, said layers in each pair containing a first layer represented by $Al_{a1}Ga_{1-a1}N$ and a second layer represented by $In_{e1}Al_{1-e1}N$, said first layers and said second layers in said Al-containing ternary nitride superlattice structure being alternately stacked.

5. The nitride-based LED device as claimed in claim 3, wherein said third defect control layer is an Al-containing ternary nitride superlattice structure which includes multiple pairs of layers, said layers in each pair containing a first layer represented by $Al_{a2}In_{1-a2}N$ and a second layer represented by $In_{c1}Al_{1-c1}N$, said first layers and said second layers in said Al-containing ternary nitride superlattice structure being alternately stacked.

6. The nitride-based LED device as claimed in claim 3, wherein said third defect control layer is an Al-containing ternary nitride monolayer structure, which includes one of AlGaN and InAlN.

7. The nitride-based LED device as claimed in claim 3, wherein said third defect control layer is an Al-containing quaternary nitride superlattice structure which includes multiple pairs of layers, said layers in each pair containing a first layer represented by $Al_{x1}In_{y1}Ga_{1-x1-y1}N$ and a second layer represented by $Al_{m1}In_{z1}Ga_{1-m1-z1}N$, said first layers and said second layers in said Al-containing quaternary nitride superlattice structure being alternately stacked, with the proviso that x1 is different from m1, or y1 is different from z1.

8. The nitride-based LED device as claimed in claim 3, wherein said third defect control layer is an Al-containing quaternary nitride monolayer structure, which includes AlInGaN.

9. The nitride-based LED device as claimed in claim 3, wherein said third defect control layer is an Al-containing nitride superlattice structure, which includes Al-containing ternary nitride and Al-containing quaternary nitride.

10. The nitride-based LED device as claimed in claim 9, wherein said Al-containing nitride superlattice structure includes multiple pairs of layers, said layers in each pair containing a first layer represented by $Al_{x2}In_{y2}Ga_{1-x2-y2}N$ and a second layer represented by $In_{x2}Ga_{1-x2-y2}N$, said first layers and said second layers in said Al-containing nitride superlattice structure being alternately stacked.

11. The nitride-based LED device as claimed in claim 9, wherein said Al-containing nitride superlattice structure includes multiple pairs of layers, said layers in each pair containing a first layer represented by $Al_{x3}In_{y3}Ga_{1-x3-y3}N$ and a second layer represented by $In_{z3}Al_{1-z3}N$, said first layers and said second layers in said Al-containing nitride superlattice structure being alternately stacked.

12. The nitride-based LED device as claimed in claim 9, wherein said Al-containing nitride superlattice structure includes multiple pairs of layers, said layers in each pair containing a first layer represented by $Al_{x4}In_{y4}Ga_{1-x4-y4}N$ and a second layer represented by $Al_{1-z4}GaN$, said first layers and said second layers in said Al-containing nitride superlattice structure being alternately stacked.

13. The nitride-based LED device as claimed in claim 9, wherein the doping concentration of said first defect control layer is greater than that of said third defect control layer.

14. The nitride-based LED device as claimed in claim 1, wherein the doping concentration of said first defect control layer is greater than that of said third defect control layer.

15. The nitride-based LED device as claimed in claim 1, wherein said first defect control layer is made of a material selected from the group consisting of GaN, InGaN, AlGaN, InAlGaN, and combinations thereof.

16. The nitride-based LED device as claimed in claim 1, wherein said second defect control layer is made of a material selected from the group consisting of GaN, InGaN, AlGaN, InAlGaN, and combinations thereof.

17. The nitride-based LED device as claimed in claim 1, further comprising an electron blocking layer disposed between said active layer and said p-type nitride semiconductor layer.

18. The nitride-based LED device as claimed in claim 1, wherein said first defect control layer has a thickness ranging from 50 Å to 5000 Å.

19. The nitride-based LED device as claimed in claim 1, wherein said second defect control layer has a thickness ranging from 10 Å to 1000 Å.

20. The nitride-based LED device as claimed in claim 1, wherein said third defect control layer has a thickness ranging from 100 Å to 5000 Å.

* * * * *